(12) United States Patent
Kitamura

(10) Patent No.: US 12,119,253 B2
(45) Date of Patent: Oct. 15, 2024

(54) TRANSPORT VEHICLE

(71) Applicant: Murata Machinery, Ltd., Kyoto (JP)

(72) Inventor: Wataru Kitamura, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 396 days.

(21) Appl. No.: 17/620,967

(22) PCT Filed: May 8, 2020

(86) PCT No.: PCT/JP2020/018612
§ 371 (c)(1),
(2) Date: Dec. 20, 2021

(87) PCT Pub. No.: WO2020/255577
PCT Pub. Date: Dec. 24, 2020

(65) Prior Publication Data
US 2022/0359251 A1 Nov. 10, 2022

(30) Foreign Application Priority Data
Jun. 20, 2019 (JP) .................. 2019-114535

(51) Int. Cl.
*H01L 21/677* (2006.01)
*B65G 1/04* (2006.01)

(52) U.S. Cl.
CPC ...... *H01L 21/67733* (2013.01); *B65G 1/0457* (2013.01); *H01L 21/67706* (2013.01); *H01L 21/67727* (2013.01); *H01L 21/6773* (2013.01); *B65G 2201/0297* (2013.01)

(58) Field of Classification Search
CPC ......... H01L 21/67733; H01L 21/67706; H01L 21/67727; H01L 21/6773; H01L 21/67276; H01L 21/67294; H01L 21/67736; B65G 1/0457; B65G 2201/0297; B65G 1/00; B65G 1/04
See application file for complete search history.

(56) References Cited

U.S. PATENT DOCUMENTS

| 9,758,308 | B1 | 9/2017 | Nishikawa et al. |
| 2009/0035104 | A1 | 2/2009 | Onishi et al. |
| 2011/0241845 | A1* | 10/2011 | Sullivan ............ H01L 21/67294 |
| | | | 340/10.42 |
| 2016/0060036 | A1 | 3/2016 | Nakade |

(Continued)

FOREIGN PATENT DOCUMENTS

| JP | S60-013801 A | 1/1985 |
| JP | H09-110398 A | 4/1997 |
| JP | H09-295707 A | 11/1997 |

(Continued)

OTHER PUBLICATIONS

English translation of JP2005001804A (Year: 2005).*
(Continued)

*Primary Examiner* — Daniel D Chang
(74) *Attorney, Agent, or Firm* — DLA Piper LLP (US)

(57) ABSTRACT

A transport vehicle includes: a traveler; a transferer that is mounted on the traveler and receives or delivers an article from or to a transfer destination; and an antenna that is provided so that at least the position or the posture thereof can be changed to follow the action of the transferer, and that performs wireless communication with another device.

5 Claims, 9 Drawing Sheets

(56) References Cited

U.S. PATENT DOCUMENTS

2016/0272468 A1    9/2016  Izumi
2017/0086540 A1    1/2017  Onda et al.

FOREIGN PATENT DOCUMENTS

| JP | 2715130    | B  | 2/1998  |
|----|------------|----|---------|
| JP | 2005-001804| A  | 1/2005  |
| JP | 5266683    | B2 | 8/2013  |
| JP | 2016-175506| A  | 9/2016  |
| JP | 6041234    | B2 | 12/2016 |
| JP | 2018-118809| A  | 8/2018  |
| JP | 6365136    | B2 | 8/2018  |
| KR | 2016-0130478| A | 11/2016 |

OTHER PUBLICATIONS

Extended European Search Report dated May 24, 2023, of counterpart European Patent Application No. 20827173.4.
Request for the Submission of an Opinion dated Jun. 12, 2023, of counterpart Korean Patent Application No. 10-2021-7040980, along with an English translation.
Notice of Reasons for Refusal dated Aug. 8, 2023, of counterpart Japanese Patent Application No. 2021-527439, along with an English translation.
Notice of Reasons for Refusal dated Feb. 17, 2023, of counterpart Japanese Patent Application No. 2021-527439, along with an English translation.

* cited by examiner

TRANSPORT VEHICLE

TECHNICAL FIELD

This disclosure relates to a transport vehicle.

BACKGROUND

In semiconductor manufacturing factories, a transport vehicle system is used to transport articles such as FOUPs for containing semiconductor wafers and reticle pods for containing reticles. Such a transport vehicle system includes a plurality of transport vehicles that travel on a track and a controller that controls the plurality of transport vehicles. Each of the plurality of transport vehicles includes an in-vehicle controller that controls the transport vehicle of its own, and the in-vehicle controller controls, on the basis of a transport instruction received from the host controller, the transport vehicle of its own to thereby cause it to travel on the track and transfers articles. It is known that each transport vehicle communicates information such as a transport instruction with the host controller through wireless communication. For example, if another transport vehicle traveling on the track obstructs wireless communication and causes a reduction in the radio wave intensity of the wireless communication, information cannot be sufficiently communicated with the host controller, and this poses an obstacle to the operation of the transport vehicle. A technique has been proposed in which when the radio wave intensity is reduced in the way mentioned above, the posture of the antenna performing communication is changed on a moving body (transport vehicle) to increase the radio wave intensity (for example, see Japanese Unexamined Patent Application, First Publication No. S60-013801).

In JP '801, the posture of the antenna is changed on the moving body, however, a driving mechanism for changing the posture of the antenna needs to be provided separately from the existing configuration in the moving body. Mounting an antenna driving mechanism on the transport vehicle will incur an increase in the size and weight of the transport vehicle, which is contrary to the demand for miniaturization and weight reduction of the transport vehicle. Also, in the transport vehicle system as described above, since a plurality of transport vehicles are used in operation, mounting an antenna driving mechanism on each transport vehicle will lead to an increase in the cost of the transport vehicle system.

It could therefore be helpful to provide a transport vehicle capable of changing at least the position or the posture of an antenna without separately providing a mechanism for driving the antenna.

SUMMARY

A transport vehicle comprises a traveler. The transport vehicle comprises a transferer mounted on the traveler and receives or delivers an article from or to a transfer destination. The transport vehicle comprises an antenna that is provided so that at least the position or the posture thereof can be changed to follow the action of the transferer, and that performs wireless communication with another device.

The transport vehicle comprises a rotation driver that rotates the transferer around a vertical axis, and the position of the antenna around the vertical axis may be changed to follow the rotation of the transferer by the rotation driver. The transferer may include a lateral mechanism that causes a holder for holding an article to move horizontally, the rotation driver may cause the lateral mechanism to rotate around the vertical axis, and the antenna may be provided in a portion of the transferer other than the portion that is moved horizontally by the lateral mechanism.

The transport vehicle comprises a frame that surrounds the transferer and is rotated around the vertical axis together with the transferer by the rotation driver, and the antenna may be mounted on the frame. The antenna may be mounted in a state of projecting downward from a lower end of the frame. The transport vehicle comprises a controller that controls the traveler, and when the traveler travels on a grid-patterned track, the controller may control the traveler to proceed to a cell if a procession permission corresponding to each of the cells of the grid of the track is granted by communicating with the another device via the antenna, and not to proceed to the cell if the procession permission is not granted.

According to the above transport vehicle, the antenna is provided so that at least the position or the posture thereof can be changed to follow the action of the transferer, and it is therefore possible, using the existing transferer, to change at least the position or the posture of the antenna without separately providing a mechanism for driving the antenna. It is also possible to improve the state of communication in the transport vehicle and suppress the increase in size and weight of the transport vehicle.

With the configuration in which there is included a rotation driver that rotates the transferer around a vertical axis, and the position of the antenna around the vertical axis is changed to follow the rotation of the transferer caused by the rotation driver, it is possible by using the rotation driver of the transferer to reliably change the position of the antenna. In the configuration in which the transferer includes a lateral mechanism that causes a holder for holding an article to move horizontally, the rotation driver causes the lateral mechanism to rotate around the vertical axis, and the antenna is provided in a portion of the transferer other than the portion that is moved horizontally by the lateral mechanism, it is possible to prevent interference between the antenna and the portion that is moved horizontally by the lateral mechanism.

In the configuration in which there is included a frame that surrounds the transferer and is rotated around the vertical axis together with the transferer by the rotation driver, and the antenna is mounted on the frame, the position of the antenna can be reliably changed by the frame that is rotated by the rotation driver. In the configuration in which the antenna is mounted in a state of projecting downward from a lower end of the frame, the antenna does not project horizontally, and therefore, it is possible even when passing another transport vehicle to prevent interference between the antenna and the another transport vehicle. With the configuration in which when the traveler travels on a grid-patterned track, the controller controlling the traveler performs control to cause the traveler to proceed to a cell if a procession permission corresponding to each of the cells of the grid of the track is granted by communicating with the another device via the antenna, and to not allow the traveler to proceed to the cell if the procession permission is not granted, there are some instances where transport vehicles may overcrowd a part of the grid-patterned track and may consequently cause a communication failure and, in those instances, it is possible to avoid a problem for a transport vehicle becoming unable to move from a grid cell, by changing at least the position or the posture of the antenna to improve the state of communication.

DESCRIPTION OF REFERENCE SIGNS

Figure 1:
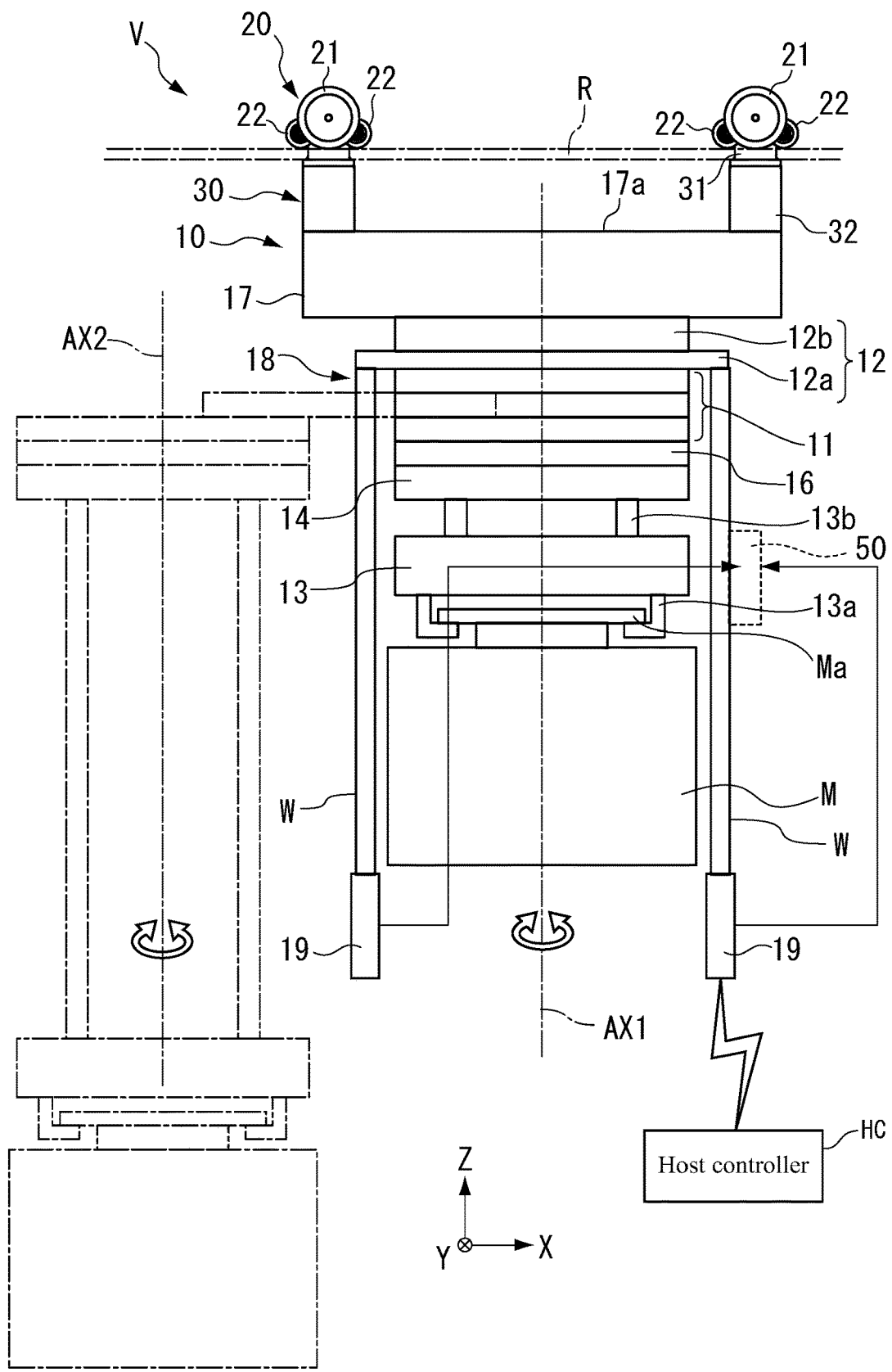
FIG. 1 is a side view showing a transport vehicle according to an example.

C: Grid cell (cell)
M: Article
R: Track
BC: Blocking controller (controller)
HC: Host controller (controller)
V, V1 to V6: Transport vehicle
W: Frame
AP: Access point
AX1: Vertical axis
SYS: Transport vehicle system
10: Main body
11: Lateral mechanism
12: Rotation driver
13: Holder
18: Transferer
19, 19A, 19B: Antenna
20: Traveler
50: In-vehicle controller
51: Memory storage
52: Communicator
53: Traveling controller
54: Transfer controller
55: Procession permission generator
56: Determiner
57: State information processor

DETAILED DESCRIPTION

The following describes an example of my transport vehicles with reference to the drawings. However, this disclosure is not limited to the example. In the drawings, scale is changed as necessary to illustrate the example such as by enlarging or emphasizing a portion. In the following drawings, an XYZ coordinate system is used to describe the directions in each drawing. In the XYZ coordinate system, a plane that is parallel to a horizontal plane is defined as an XY plane. A direction along this XY plane is denoted as X direction, and a direction orthogonal to the X direction is denoted as Y direction. The traveling direction of the transport vehicle V can change from the direction shown in the figures to another direction, and may also travel along, for example, a curved direction in some instances. A direction perpendicular to the XY plane is denoted as Z direction. For each of the X direction, the Y direction, and the Z direction, description is made with a definition in which a direction indicated by an arrow is the positive (+) direction and a direction opposite to the direction indicated by the arrow is the negative (−) direction. Moreover, the pivoting direction around the vertical axis or the Z axis is referred to as θZ direction.

Figure 2:
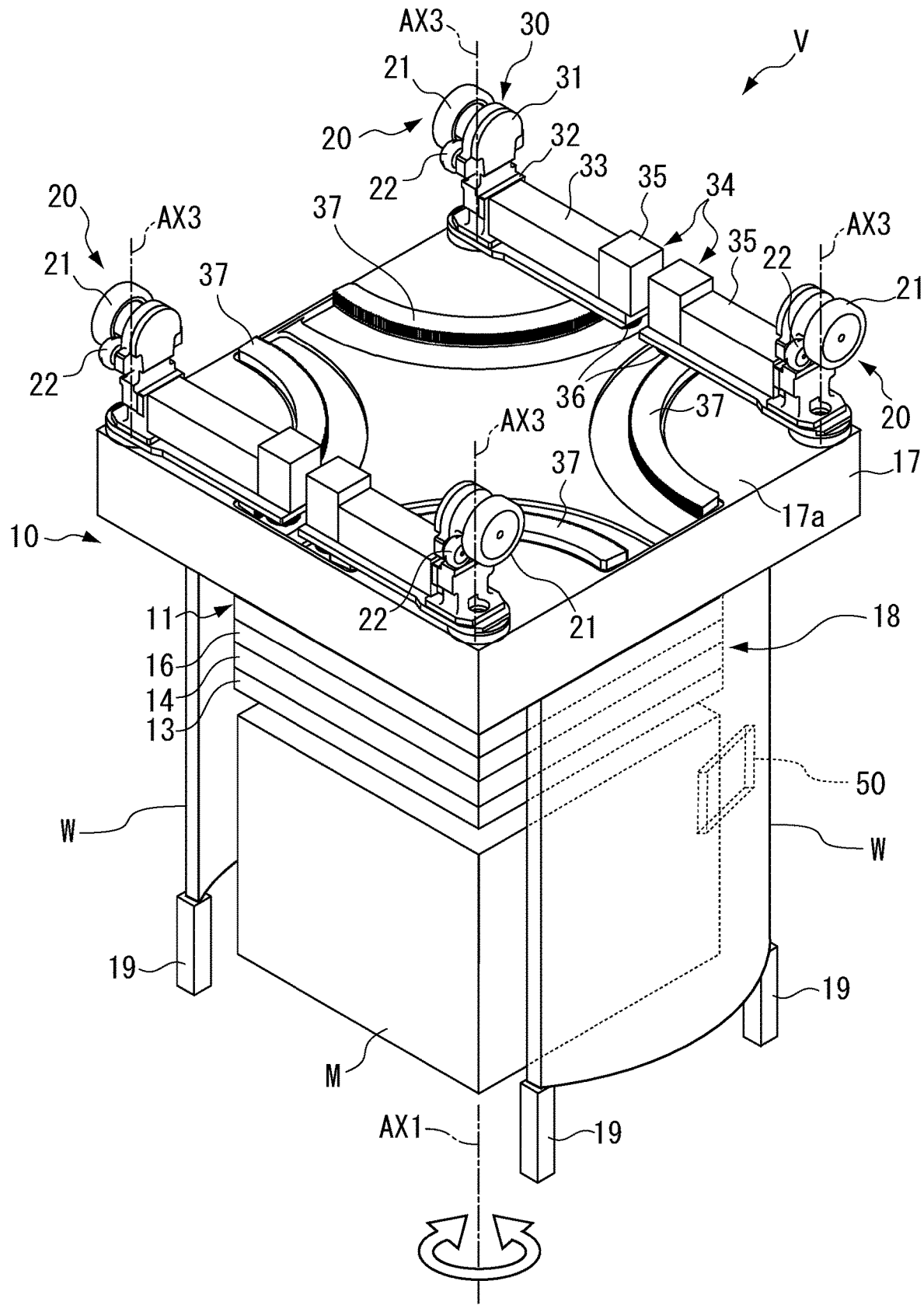
FIG. 2 is a perspective view of the transport vehicle shown in FIG. 1.
Figure 3:
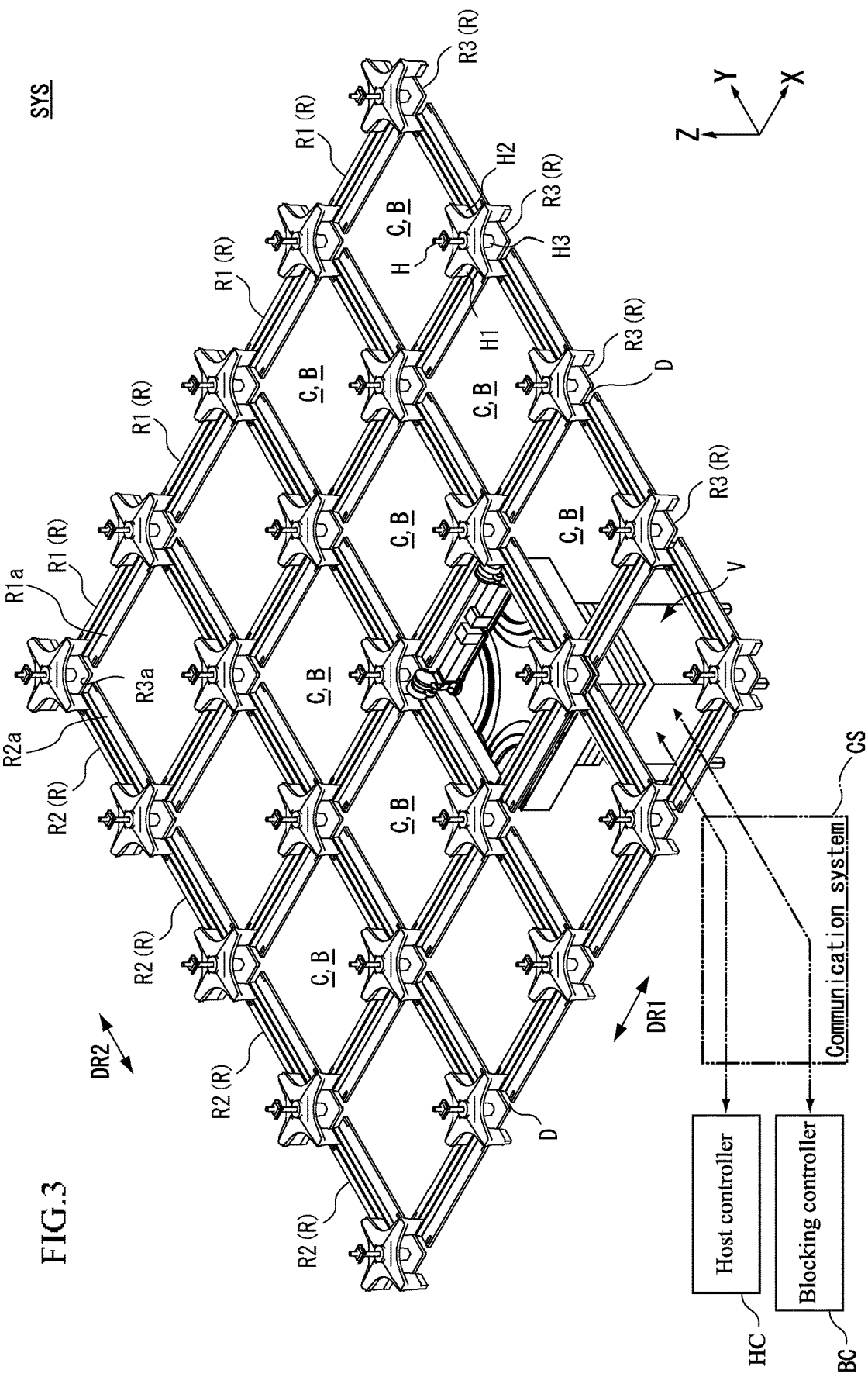
FIG. 3 is a perspective view showing an example of a transport vehicle system.

FIG. 1 is a side view showing a transport vehicle V according to the example. FIG. 2 is a perspective view of the transport vehicle V shown in FIG. 1. FIG. 3 is a perspective view showing an example of a transport vehicle system SYS that uses transport vehicles V. The transport vehicle system SYS is a system for transporting articles M by transport vehicles V in, for example, a clean room of a semiconductor manufacturing factory. The transport vehicle system SYS includes a plurality of transport vehicles V1 to Vn (hereunder, may be collectively referred to as transport vehicles V), and controllers (host controller HC, blocking controller BC) that control the plurality of transport vehicles V. The host controller HC may in some instances include a transport controller and a host controller.

An example will be described in which the transport vehicles V are overhead transport vehicles. The transport vehicles V move along a track R of the transport vehicle system SYS. The transport vehicles V move along the track R of the transport vehicle system SYS and transport articles M such as FOUPs accommodating semiconductor wafers or reticle pods accommodating reticles, and receive or deliver the articles M to transfer destinations not shown in the drawings.

The track R is installed on or in the vicinity of the ceiling of a building such as a clean room. The track R is provided above a processing apparatus (not shown in the drawings), a stocker (automated warehouse, not shown in the drawings), a buffer (not shown in the drawings) and so forth. The above processing apparatus is, for example, an exposure apparatus, a coater/developer, a film forming apparatus, or an etching apparatus, and performs various processes on semiconductor wafers transported in containers (articles M) by the transport vehicles V. The stocker mentioned above stores articles M transported by the transport vehicles V. The buffer mentioned above temporarily stores articles M transported by the transport vehicles V. The transport vehicle V receives or delivers an article M from or to the load port of the above processing apparatus or stocker or to the above buffer.

The track R is an example of the form of a track. The track R is a grid-patterned track having first tracks R1, second tracks R2, and intersection tracks R3. Hereinafter, the track R will be referred to as grid-patterned track R. The first tracks R1 each extend along the X direction (first direction DR1). The second tracks R2 each extend along the Y direction (second direction DR2). The first direction DR1 and the second direction DR2 are orthogonal to each other, and the plurality of first tracks R1 and the plurality of second tracks R2 are provided along the directions orthogonal to each other.

The intersection track R3 is arranged at the intersection of the first track R1 and the second track R2. The intersection track R3 is adjacent to the first track R1 in the first direction DR1, and is adjacent to the second track R2 in the second direction DR2. The intersection track R3 forms a track portion formed in the extending direction of the first track R1 and a track portion formed in the extending direction of the second track R2. In the grid-patterned track R, the first tracks R1 and the second tracks R2 orthogonally intersect with each other, thereby establishing a state where a plurality of Cs (cells) are adjacent to each other as seen in a plan view. One grid cell C is a portion surrounded, as seen in a plan view, by two first tracks R1 adjacent to each other in the second direction DR2 and by two second tracks R2 adjacent to each other in the first direction DR1. FIG. 3 shows a part of the grid-patterned track R, and the grid-patterned track R is formed in a manner such that a configuration similar to that shown in the figure continues in the first direction DR1 (X direction) and in the second direction DR2 (Y direction).

The first tracks R1, the second tracks R2, and the intersection tracks R3 are suspended from the ceiling not shown in the drawings by suspenders H (see FIG. 3). Each suspender H has first portions H1 to suspend the first track R1, second portions H2 to suspend the second track R2, and a third portion H3 to suspend the intersection track R3. The first portion H1 and the second portion H2 are provided at two opposing locations having the third portion H3 therebetween.

The first track R1, the second track R2, and the intersection track R3 have traveling surfaces R1a, R2a, and R3a respectively. Traveling wheels 21 of the transport vehicle V, which will be described later, travel (roll) on the traveling surfaces R1a, R2a, and R3a. A clearance D is formed between the first track R1 and the intersection track R3 and between the second track R2 and the intersection track R3. The clearance D is a portion through which a coupler 30 (described later) serving as a part of the transport vehicle V passes when the transport vehicle V having traveled on the first track R1 crosses the second track R2 or when the transport vehicle V having traveled on the second track R2 crosses the first track R1. Therefore, the clearance D is provided with a width that allows the coupler 30 to pass therethrough. The first tracks R1, the second tracks R2, and the intersection tracks R3 are provided along the same or substantially the same horizontal plane. The first tracks R1, the second tracks R2, and the intersection tracks R3 are such that the traveling surfaces R1a, R2a, and R3a thereof are arranged on the same or substantially the same horizontal plane.

The transport vehicle system SYS includes a communication system CS. The communication system CS is, for example, a wireless communication system such as a wireless LAN. The communication system CS is used for communication between the transport vehicles V, the host controller HC, and the blocking controller BC. The transport vehicle V, the host controller HC, and the blocking controller BC are all capable of communicating with each other via the communication system CS and capable of transmitting and receiving various information to and from each other.

In a traveling region of the transport vehicles V, a plurality of blocking sections B are designated (see FIG. 3), each of which undergoes, when occupied by one of the plurality of transport vehicles V, exclusive control to prohibit another transport vehicle V from proceeding thereto. A blocking section B is set for each grid cell C. The transport vehicle V is controlled to be allowed to pass through a blocking section B when a procession permission for the blocking section B is granted by the blocking controller BC while being prohibited to proceed to the blocking section B when the procession permission is not granted by the blocking controller BC. Thus, interference between the transport vehicles V can be prevented by exclusive control.

When traveling on the grid-patterned track R, the transport vehicle V repeatedly proceeds from one grid cell C to an adjacent grid cell C to perform traveling. The transport vehicle V can selectively travel from one grid cell C in the first direction DR1 (+X direction, −X direction) or in the second direction DR2 (+Y direction, −Y direction). Now, a configuration of the transport vehicle V will be described. As shown in FIGS. 1 and 2, the transport vehicle V has a main body 10, travelers 20, couplers 30, and an in-vehicle controller 50 (controller).

The main body 10 is arranged below the grid-patterned track R (on the −Z side). The main body 10 is formed, for example, in a rectangular shape as seen in a plan view. The main body 10 is formed in a size that fits in a single grid cell C (see FIG. 3) in the grid-patterned track R as seen in a plan view. As a result, even when the transport vehicles V traveling respectively on the first track R1 and the second track R2 adjacent to each other pass one another, the main bodies 10 thereof would not interfere with each other. The main body 10 includes an upper unit 17, a transferer 18, antennas 19. The upper unit 17 is suspended from the travelers 20 via the couplers 30. The upper unit 17 is, for example, of a rectangular shape as seen in a plan view, and has four corners on the upper faces 17a.

The upper unit 17 of the main body 10 has a traveling wheel 21, a coupler 30, and a direction changer 34 provided at each of the four corners thereof. The four traveling wheels 21 enable stable suspension of the main body 10 and stable traveling of the main body 10. The transport vehicle V can receive or deliver an article M from or to a predetermined position, using the transferer 18.

The transferer 18 is provided below the upper unit 17. The transferer 18 can rotate around the vertical axis AX1 along the Z direction (vertical direction). The transferer 18 has a holder 13 to hold an article M, a lift driver 14 to raise or lower the holder 13 in the vertical direction, a lateral mechanism 11 to move the lift driver 14 in the horizontal direction, and a rotation driver 12 to rotate the lateral mechanism 11. The holder 13 grasps a flange Ma provided on an article M to thereby suspend and hold the article M. The holder 13 is, for example, a chuck having claws 13a movable in the horizontal direction, and causes the claws 13a to move to under the flange Ma of the article M and raises the holder 13, to thereby hold the article M. The holder 13 is connected to suspenders 13b such as wires or belts. The action of the claws 13a is controlled by the in-vehicle controller 50.

The lift driver 14 is, for example, a hoist, and lowers the holder 13 by feeding out suspenders 13b and lifts the holder 13 by taking up the suspenders 13b. The lift driver 14 is controlled by the in-vehicle controller 50 to raise or lower the holder 13 at a predetermined speed. Also, the lift driver 14 is controlled by the in-vehicle controller 50 to maintain the holder 13 at a target height.

The lateral mechanism 11 has a plurality of movable plates arranged stacked, for example, in the Z direction. The movable plates can move relatively in the Y direction. The upper face side of the uppermost movable plate is supported by the rotation driver 12. The lift driver 14 is mounted on the lower face side of the lowermost movable plate. The lateral mechanism 11 can laterally extend (slide and move) the lift driver 14 and the holder 13 mounted on the lowermost movable plate, for example, in the horizontal direction orthogonal to the traveling direction of the transport vehicle V, by moving the movable plates by a driver not shown in the drawings. The action of the lateral mechanism 11 is controlled by the in-vehicle controller 50.

The rotation driver 12 is provided between the lateral mechanism 11 and the upper unit 17. The rotation driver 12 causes the lateral mechanism 11 to rotate relative to the upper unit 17 axially around the vertical axis AX1. The rotation driver 12 has a rotation member 12a and a drive source 12b. The rotation member 12a is provided to be rotatable around the vertical axis. The rotation member 12a supports the lateral mechanism 11. The uppermost movable plate in the lateral mechanism 11 is integrally mounted on the rotation member 12a. For example, an electric motor or the like is used as the drive source 12b, and the drive source 12b is integrally mounted on the upper unit 17. The drive source 12b causes the rotation member 12a to rotate around the vertical axis AX1. The rotation driver 12 can, by rotating the rotation member 12a by the driving force from the drive source 12b, rotate the lateral mechanism 11 (lift driver 14 and holder 13) the vertical axis AX1. That is to say, the direction in which the lateral mechanism 11 laterally extends the lift driver 14 and the holder 13, is rotated around the vertical axis AX1 by the rotation driver 12.

A second rotation driver 16 is provided between the lateral mechanism 11 and the lift driver 14. The second rotation driver 16 can cause the lift driver 14 (holder 13) to rotate with respect to the lateral mechanism 11 around the vertical axis AX2. The second rotation driver 16 may be provided on the holder 13 rather than between the lateral mechanism 11 and the lift driver 14. In such a configuration, the second rotation driver 16 can cause the holder 13 to rotate with respect to the lift driver 14 around the vertical axis AX2.

As shown in FIGS. 1 and 2, a frame W may be provided to surround the transferer 18 and the article M held by the transferer 18. The frame W is of a cylindrical shape having an open-ended bottom, and is also of a shape having a cutout portion through which the movable plates of the lateral mechanism 11 project. The upper end of the frame W is mounted on the rotation member 12a of the rotation driver 12, and the frame W rotates axially around the vertical axis AX1 as the rotation member 12a rotates.

Each traveler 20 has a traveling wheel 21 and auxiliary wheels 22. The traveling wheel 21 is arranged in each of the four corners on the upper face 17a of the upper unit 17 (main body 10). Each traveling wheel 21 is mounted on an axle provided in the coupler 30. The axle is provided in parallel or substantially parallel along the XY plane. Each traveling wheel 21 is driven to rotate by the driving force of a traveling driver 33, which will be described later. Each traveling wheel 21 rolls on the traveling surfaces R1a, R2a, and R3a of the first track R1, the second track R2, and the intersection track R3 of the grid-patterned track R, causing the transport vehicle V to travel. The configuration is not limited to driving all of the four traveling wheels 21 to rotate by the drive force of the traveling driver 33, and some of the four traveling wheels 21 may be driven to rotate.

Each traveling wheel 21 is provided to be able to pivot in the θZ direction around the pivoting axis AX3. The traveling wheel 21 is pivoted in the θZ direction by the direction changer 34 described later and, as a result, the traveling direction of the transport vehicle V can be changed. The auxiliary wheels 22 are each arranged in front and rear of the traveling wheel 21 in the traveling direction. As with the traveling wheel 21, each auxiliary wheel 22 can rotate axially around the axle, which is parallel or substantially parallel with the XY plane. The lower end of the auxiliary wheel 22 is set higher than the lower end of the traveling wheel 21. Therefore, when the traveling wheel 21 is traveling on the traveling surfaces R1a, R2a, and R3a, the auxiliary wheels 22 do not come into contact with the traveling surfaces R1a, R2a, and R3a. When the traveling wheel 21 passes through the clearance D (see FIG. 3), the auxiliary wheels 22 come into contact with the traveling surfaces R1a, R2a, and R3a, preventing the traveling wheel 21 from falling. The configuration is not limited to providing two auxiliary wheels 22 for a single traveling wheel 21 and, for example, a single auxiliary wheel 22 may be provided for a single traveling wheel 21, or no auxiliary wheel 22 may be provided.

As shown in FIG. 2, the couplers 30 connect the upper unit 17 of the main body 10 and the travelers 20. The coupler 30 is provided at each of the four corners on the upper face 17a of the upper unit 17 (main body 10). The main body 10 is suspended by the couplers 30 and is arranged below the grid-patterned track R. The coupler 30 has a support 31 and a connector 32. The support 31 rotatably supports the rotation shaft of the traveling wheel 21 and the rotation shafts of the auxiliary wheels 22. The support 31 maintains the relative position between the traveling wheel 21 and the auxiliary wheels 22. The support 31 is formed, for example, in a plate shape with a thickness that allows it to pass through the clearance D (see FIG. 3).

The connectors 32 each extend downward from the support 31 and are coupled to the upper face 17a of the upper unit 17 to hold the upper unit 17. The connector 32 therein includes a transmission for transmitting the driving force of the traveling driver 33 described later to the traveling wheel 21. This transmission may be of a configuration in which a chain or a belt is used, or a configuration in which a gear train is used. The connector 32 is provided to be able to pivot in the θZ direction around the pivoting axis AX3. The pivoting of the connector 32 around the pivoting axis AX3 can cause the traveling wheel 21 to pivot around the pivoting axis AX3 in the θZ direction via the support 31.

The traveling driver 33 and the direction changer 34 are provided in the coupler 30. The traveling driver 33 is attached to the connector 32. The traveling driver 33 is a drive source for driving the traveling wheel 21 and, for example, an electric motor or the like is used therefor. Each of the four traveling wheels 21 is driven by the traveling driver 33 to serve as a driving wheel. The four traveling wheels 21 are controlled by the in-vehicle controller 50 to rotate at the same or substantially the same rotation speed. If any one of the four traveling wheels 21 is not used as a driving wheel, the traveling driver 33 is not attached to the connector 32 thereof.

The direction changer 34 causes the connector 32 of the coupler 30 to pivot around the pivoting axis AX3 to thereby cause the traveling wheel 21 to pivot around the pivoting axis AX3 in the θZ direction. It is possible, by causing the traveling wheel 21 to pivot in the θZ direction, to switch from a first state where the traveling direction of the transport vehicle V is the first direction DR1 to a second state where the traveling direction is the second direction DR2, or from the second state where the traveling direction is the second direction DR2 to the first state where the traveling direction is the first direction DR1.

The direction changer 34 has a drive source 35, a pinion gear 36, and a rack 37. The drive source 35 is mounted on a side face of the traveling driver 33 away from the pivoting axis AX3. As the drive source 35, for example, an electric motor or the like is used. The pinion gear 36 is mounted on the lower surface side of the drive source 35, and is driven to rotate in the θZ direction by the driving force generated by the drive source 35. The pinion gear 36 is of a circular shape as seen in a plan view and has a plurality of teeth on the outer circumference thereof along the circumferential direction. The rack 37 is fixed to the upper face 17a of the upper unit 17. The rack 37 is provided at each of the four corners on the upper face 17a of the upper unit 17, and is provided having an arc shape (sectorial shape) centered on the pivoting axis AX3 of the traveling wheel 21. The rack 37 has a plurality of teeth which mesh with the teeth of the pinion gear 36, on the outer circumference thereof along the circumferential direction.

The pinion gear 36 and the rack 37 are arranged in the state where the teeth of the pinion gear 36 and the teeth of the rack 37 are in mesh with each other. As the pinion gear 36 rotates in the θZ direction, the pinion gear 36 moves in the circumferential direction around the pivoting axis AX3 along the outer circumference of the rack 37. As a result of this movement of the pinion gear 36, the connector 32 pivots, and the traveling driver 33 and the direction changer 34 pivot together with the pinion gear 36 in the circumferential direction and around the pivoting axis AX3.

As a result of the pivoting of the direction changer 34, the traveling wheel 21 and the auxiliary wheels 22 arranged in each of the four corners on the upper face 17a all pivot in the θZ direction around the pivoting axis AX3 within a range of 90 degrees. The driving of the direction changer 34 is controlled by the in-vehicle controller 50. The in-vehicle controller 50 may instruct the four traveling wheels 21 to perform the pivoting operation at the same timing, or may instruct them to perform the pivoting operations at different timings. By causing the traveling wheel 21 and the auxiliary wheels 22 to pivot, the traveling wheel 21 shifts from the state of being in contact with one of the first track R1 and the second track R2 to the state of being in contact with the other. In other words, the traveling wheel 21 shifts from the state where the direction of the rotation axis of the traveling wheel 21 is one of the first direction DR1 and the second direction DR2 to the state where direction of the rotation axis of the traveling wheel 21 is the other. As a result, it is possible to switch between the first state where the traveling direction of the transport vehicle V is the first direction DR1 (X direction) and the second state where the traveling direction is the second direction DR2 (Y direction).

The transport vehicle V includes a position detector (not shown in the drawings) that detects position information. The position detector detects the current position of the transport vehicle V by detecting a position marker (not shown in the drawings) such as a bar code indicating position information. The position detector uses, for example, a bar code reader capable of reading bar codes and detects a position marker in a contactless manner. The position marker is installed, for example, at each grid cell C of the grid-patterned track R.

The antennas 19 are used for wireless communication to transmit and receive various information to and from other devices such as the host controller HC and the blocking controller BC. The antennas 19 are also used for wireless communication to transmit and receive various information to and from other transport vehicles V. That is to say, the transport vehicle V transmits and receives information to and from other devices via the antennas 19 through the communication system CS. The antennas 19 are electrically connected to the in-vehicle controller 50. Information received by the antennas 19 is sent to the in-vehicle controller 50. In other words, the in-vehicle controller 50 transmits and receives information to and from other devices via the antennas 19 through the communication system CS.

At least the positions or the postures of the antennas 19 can be changed to follow the action of the transferer 18. In other words, the antennas 19 are mounted on a member in which at least the positions or the postures thereof changes along with the operation of the transferer 18, and as the position or the posture of the member changes, the positions or the postures of the antennas 19 change accordingly. The antennas 19 are mounted, for example, on the lower end of the frame W. Four antennas 19 are arranged around the axis of the vertical axis AX1 at predetermined angle intervals (for example, at 90° intervals), at the lower end of the frame W. The number and arrangement of the antennas 19 are not limited to the above example. By using a plurality of antennas 19, wireless communication can be established with other devices by any of the antennas 19, and redundancy can be ensured. The antennas 19 are not limited to being provided as multiple units, and only one antenna 19 may be provided.

The antennas 19 are each mounted in a state of projecting downward from the lower end of the frame W. As a result, the antennas 19 do not project horizontally, and therefore, on the grid-patterned track R, for example, even when passing another transport vehicle V, it is possible to prevent interference between the antenna 19 and the another transport vehicle V.

Figure 4A:
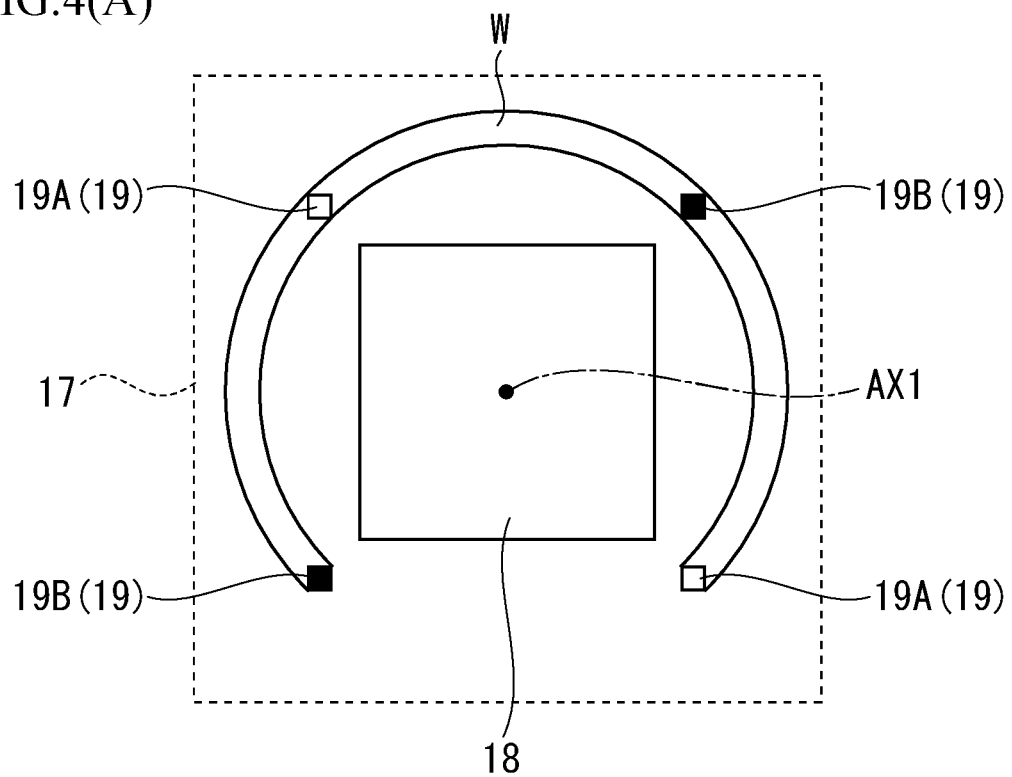
FIG. 4(A) and FIG. 4(B) are diagrams each showing an example where the transport vehicle is viewed from below.
Figure 4B:
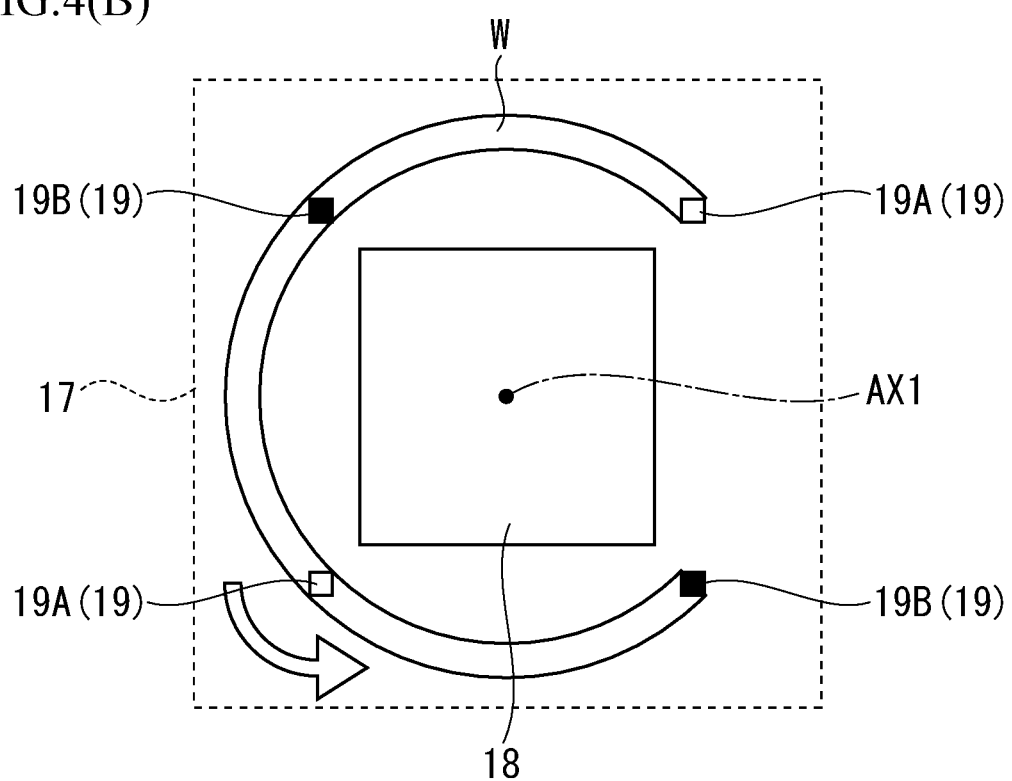

FIGS. 4(A) and 4(B) are diagrams each showing an example where the transport vehicle V is viewed from below. As shown in FIG. 4(A), the antennas 19 are composed of a pair of antennas 19A arranged having the vertical axis AX1 therebetween and a pair of antennas 19B arranged having the vertical axis AX1 therebetween. Among a pair of antennas 19A, 19B, for example, one of the pair of antennas 19A, 19B may be used as a primary antenna and the other may be used as an auxiliary antenna, or a pair of antennas 19A may be used as primary antennas and a pair of antennas 19B may be used as auxiliary antennas. The antennas 19A, 19B may each be set to have a different bandwidth that can be used for communication.

The antennas 19 are integrally mounted on the frame W. As a result, when the frame W is rotated axially around the vertical axis AX1 by the drive of the rotation driver 12, as shown in FIG. 4(B), the positions of the antennas 19 around the vertical axis AX1 are changed to follow the rotation of the frame W. Therefore, the positions of the antennas 19 can be easily and reliably changed by the drive of the rotation driver 12. The rotation driver 12 causes the frame W to rotate to change at least the position or the posture of each antenna 19 even when the lateral mechanism 11 does not need to be rotated. In other words, the rotation driver 12 functions as a lateral mechanism rotation driver that causes the lateral mechanism 11 (lift driver 14 and holder 13) to rotate axially around the vertical axis AX1, and as an antenna rotation driver that causes the antennas 19 to rotate axially around the vertical axis AX1.

For example, when the reception sensitivity is low with the antennas 19A, 19B, it is possible, by changing the positions of the antennas 19A, 19B by the rotation driver 12, to set the antennas 19A, 19B to positions at which the reception sensitivity is high. For example, when the communication quality of wireless communication with other devices through the communication system CS continues to stay below a predetermined value for a certain period of time or longer, or where the reception sensitivity of the antennas 19 are determined as being low, the in-vehicle controller 50 causes the rotation driver 12 to rotate (circumferentially move) the antennas 19A, 19B while monitoring the reception sensitivity. At this time, rotation of the antennas 19A, 19B may be stopped at a position where the reception sensitivity is high (a position at which transmission or reception of information becomes possible).

The portion on which the antennas 19 are mounted is not limited to the lower end of the frame W. The antennas 19 can be mounted at arbitrary positions where at least the positions or the postures of the antennas 19 can be changed to follow the action of the transferer 18. Further, the antennas 19 are provided in a portion other than the portion that is moved horizontally by the lateral mechanism 11. When the antennas 19 are mounted on a portion that is moved horizontally by the lateral mechanism 11, the lateral mechanism 11 needs to laterally extend the lift driver 14 to change the positions of the antennas 19 with a purpose of improving the reception sensitivity of the antennas 19. For this purpose, an occupation permission needs to have been obtained for the blocking section B where the lift driver 14 are to be extended laterally. However, the lateral mechanism 11 may not be able to laterally extend the lift driver 14 in some instances because such an occupation permission is obtained through wireless communication via the antennas 19. Therefore, it is desirable that the rotation driver 12 be used as a mechanism to change the positions of the antennas 19, rather than the lateral mechanism 11.

Figure 5:
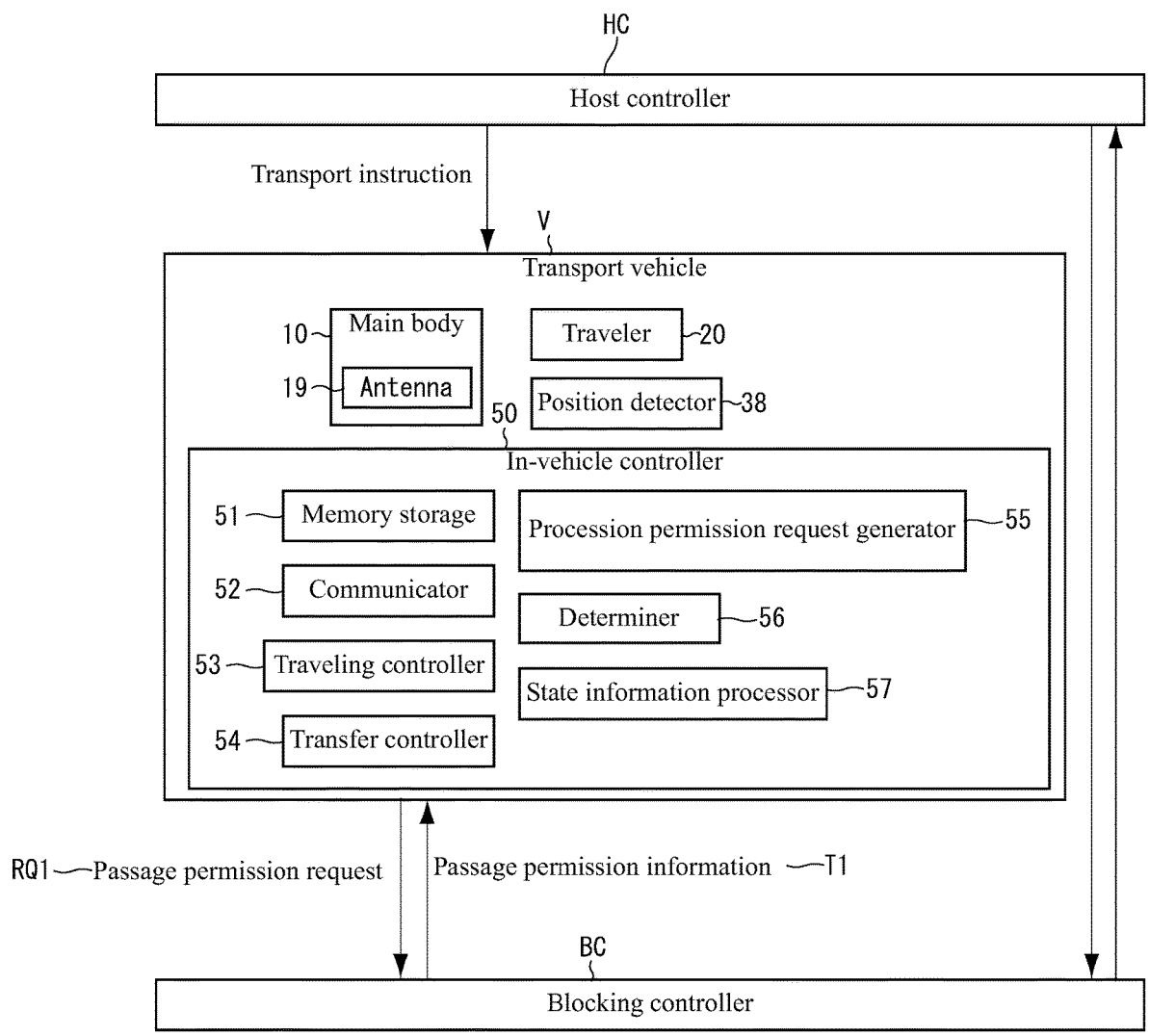
FIG. 5 is a block diagram showing an example of the transport vehicle.

FIG. 5 is a block diagram showing an example of the transport vehicle V, the host controller HC, and the blocking controller BC. The in-vehicle controller 50 comprehensively controls the transport vehicle V. The in-vehicle controller 50 includes a memory storage 51 that memorizes (stores) various data, a communicator 52, a traveling controller 53, a transfer controller 54, a procession permission request generator 55, a determiner 56, and a state information processor 57. As the in-vehicle controller 50, for example, a computer device is used. While this disclosure illustrates an example of the in-vehicle controller 50 as being provided on the frame W (see FIGS. 1 and 2), the in-vehicle controller 50 may be provided on the upper unit 17 or outside the main body 10.

The communicator 52 communicates with external devices via the antennas 19. The communicator 52 is wirelessly connected to the communication system CS (see FIG. 3). The communicator 52 performs wireless communication between the host controller HC and the blocking controller BC via the communication system CS.

The traveling controller 53 controls traveling of the transport vehicle V by controlling the traveling driver 33, the direction changer 34 and so forth. The traveling controller 53 controls, for example, traveling speed, operations related to stopping, and operations related to direction changing. The traveling controller 53 controls traveling of the transport vehicle V on the basis of transport instructions received from the host controller HC.

Also, the traveling controller 53 controls traveling so that the transport vehicle V travels in accordance with procession permissions for blocking sections B granted by the blocking controller BC (see FIG. 3). A procession permission received from the blocking controller BC is stored in the memory storage 51 as procession permission information. The procession permission information includes information indicating the blocking sections B for which a procession permission has been granted. The traveling controller 53 causes the transport vehicle V (travelers 20) to proceed to the blocking sections B, for which a procession permission has been granted, on the basis of the procession permission information. The traveling controller 53 controls traveling to not allow the transport vehicle V to proceed to blocking sections B for which no procession permission has been obtained. If a procession permission has not been obtained, the traveling controller 53 causes the transport vehicle V to stop just short of the blocking sections B and wait until a procession permission has been acquired for the blocking sections B.

The transfer controller 54 controls the transfer operation of the transferer 18 to transfer an article M, on the basis of a transport instruction. The transfer controller 54 causes the transferer 18 to operate, and controls the pickup operation to grip an article M placed at a predetermined location and the unloading operation to unload and place the held article M to a predetermined location.

The procession permission request generator 55 generates a procession permission request regarding a plurality of blocking sections B through which the transport vehicle V of its own is scheduled to pass, on a traveling route of the grid-patterned track R defined by an instruction such as a transport instruction. The procession permission request generator 55 may generate a procession permission request for each blocking section B, or may generate a procession permission request for a plurality of blocking sections B combined.

The determiner 56 determines whether or not the communication quality of wireless communication with other devices through the communication system CS has continued to stay below a predetermined value for a certain period of time or longer. For example, the determiner 56 may determine whether or not the radio wave intensity is greater than or equal to a predetermined value when transmitting or receiving various information via the antennas 19. As the radio wave intensity in such an example, the sensitivity of reception between the transport vehicle V, the host controller HC and the blocking controller BC may be used. The certain period of time mentioned above can be set to an arbitrary period of time, and may be set preliminarily by an operator or the like or may be automatically set by the in-vehicle controller 50. An example of using the radio wave intensity in wireless communication between the transport vehicle V, the host controller HC and the blocking controller BC has been described. However, the disclosure is not limited to this example. For example, the determiner 56 may use the radio wave intensity of wireless communication between the transport vehicle V and either the host controller HC or the blocking controller BC, to determine whether or not the communication quality (radio wave intensity) of the wireless communication has continued to stay below a predetermined value for a certain period of time or longer. Also, the determiner 56 may use a parameter other than radio wave intensity to determine the communication quality of wireless communication. The determiner 56 acquires the intensity of a radio wave received by the communicator 52 via the antennas 19, and determines whether or not it is greater than or equal to a predetermined value on the basis of the radio wave intensity. The predetermined value is set preliminarily and stored preliminarily in the memory storage 51, and it is set, for example, to a value at which various information can be transmitted or received with no errors or very few errors.

The determiner 56 determines whether or not the antennas 19 have rotated a predetermined amount around the vertical axis AX1. For example, when rotating the antennas 19, if the reception sensitivity is still not improving even after the antennas 19 have made a full rotation (by 360°), rotating the antennas 19 may not improve the reception sensitivity. In such a configuration, after the antennas 19 have made a full rotation, the in-vehicle controller 50 may attempt to improve the reception sensitivity by rotating the antennas 19 again after a predetermined period of time has elapsed, or may execute a fault process such as issuing an error or an alert to indicate a communication failure. Examples of an alert to be issued from the transport vehicle V include turning on or blinking a warning lamp equipped on the transport vehicle V and issuing a warning sound or the like from a speaker. Also, the in-vehicle controller 50 may, instead of issuing an error or an alert, execute another process (countermeasure) such as changing the communication channel as a fault process.

The state information processor 57 periodically generates and updates state information. The state information is stored in the memory storage 51. The state information processor 57 transmits the generated state information to the host controller HC via the communicator 52 in response to a state information request transmitted from the host controller HC. Examples of the state information include information on the current position of the transport vehicle V of its own, information indicating the current state such as normality or abnormality concerning the traveling operation or transfer operation, and information on the execution state of various instructions (being executed, execution completed, execution failed) such as transport instructions. The state information may also include information on the current positions of the antennas 19.

Figure 6:
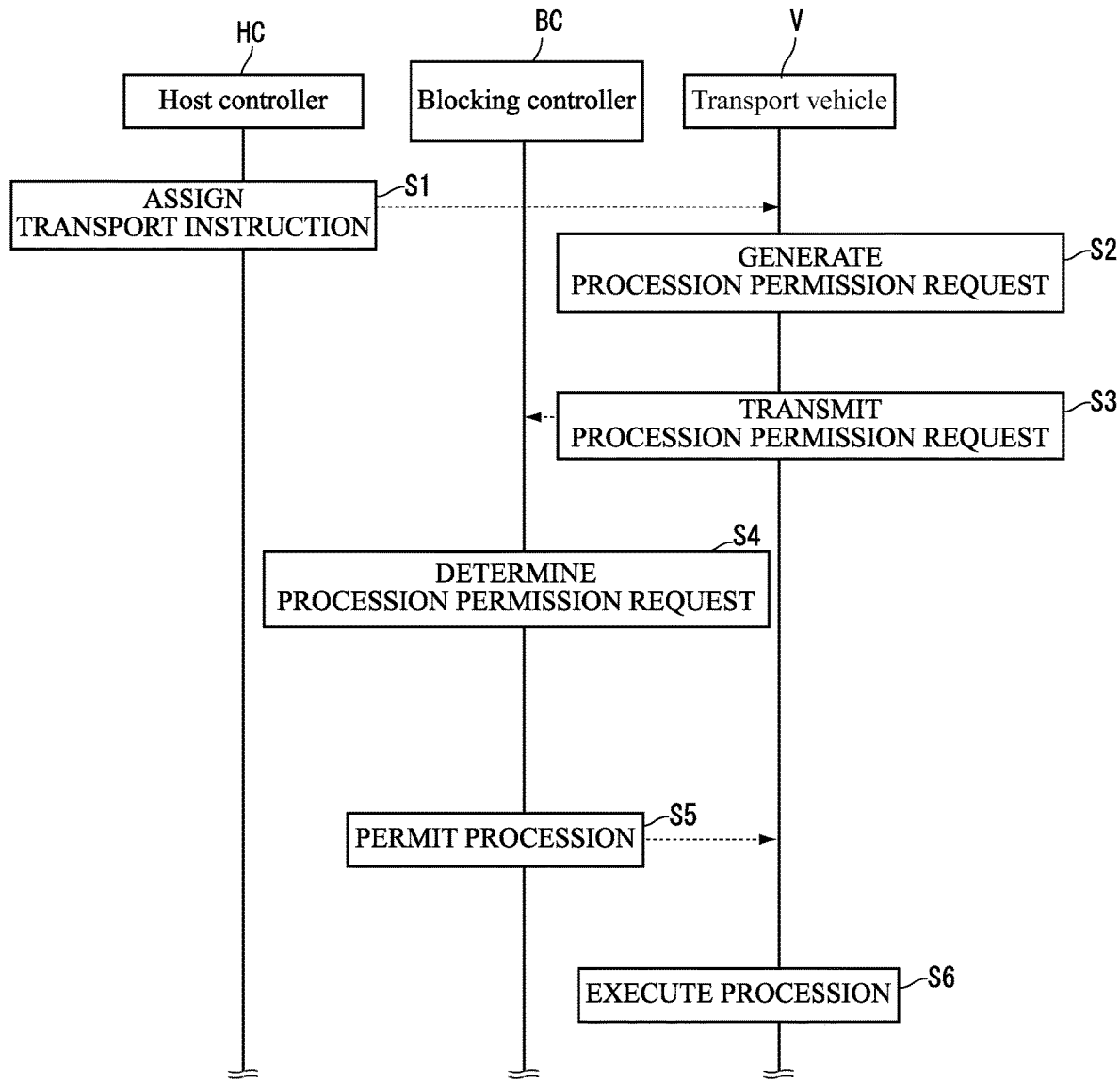
FIG. 6 is a diagram showing an example of an operation sequence of the transport vehicle and controllers.
Figure 7:
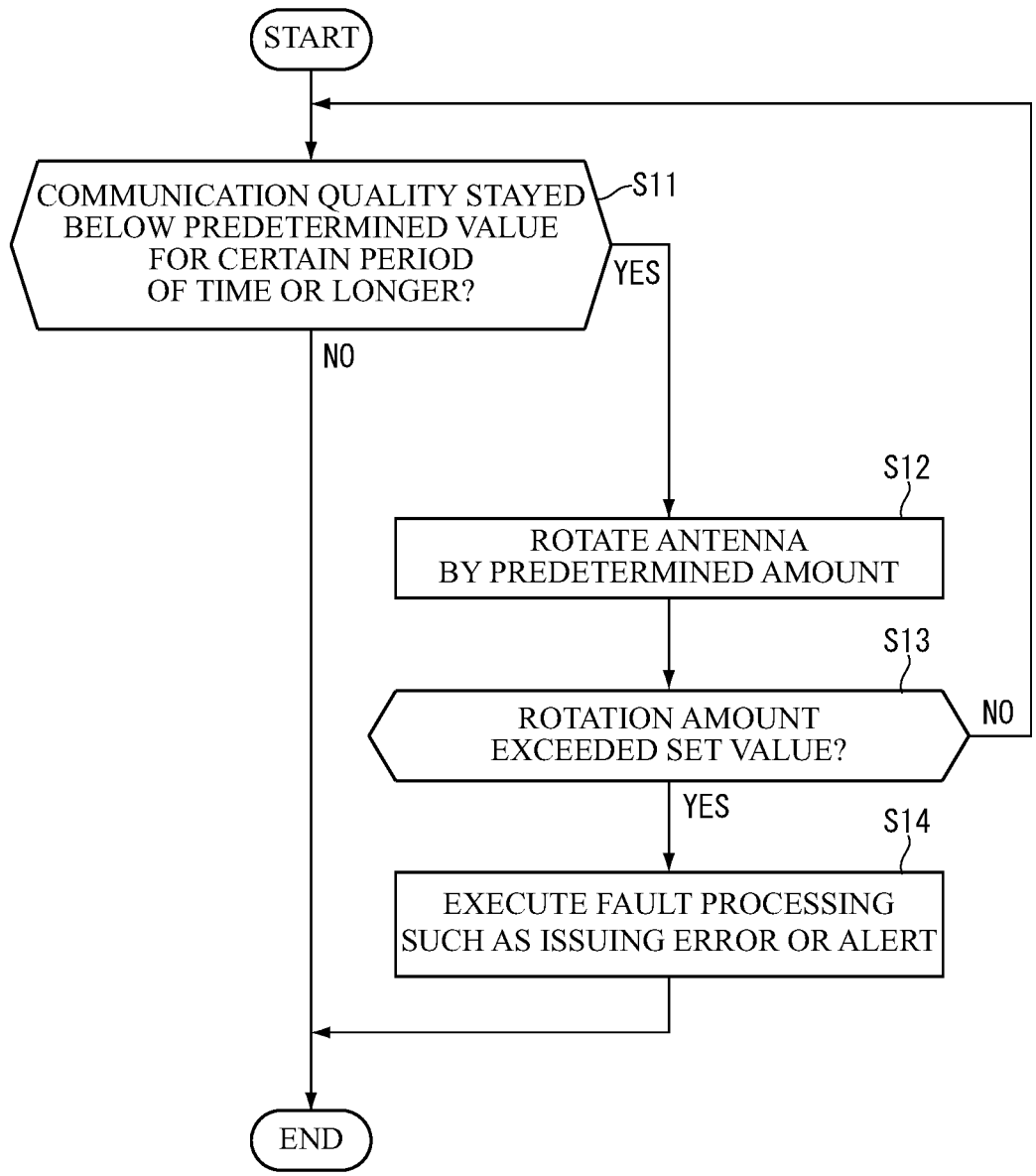
FIG. 7 is a flowchart showing an example of an operation of an in-vehicle controller.
Figure 8:
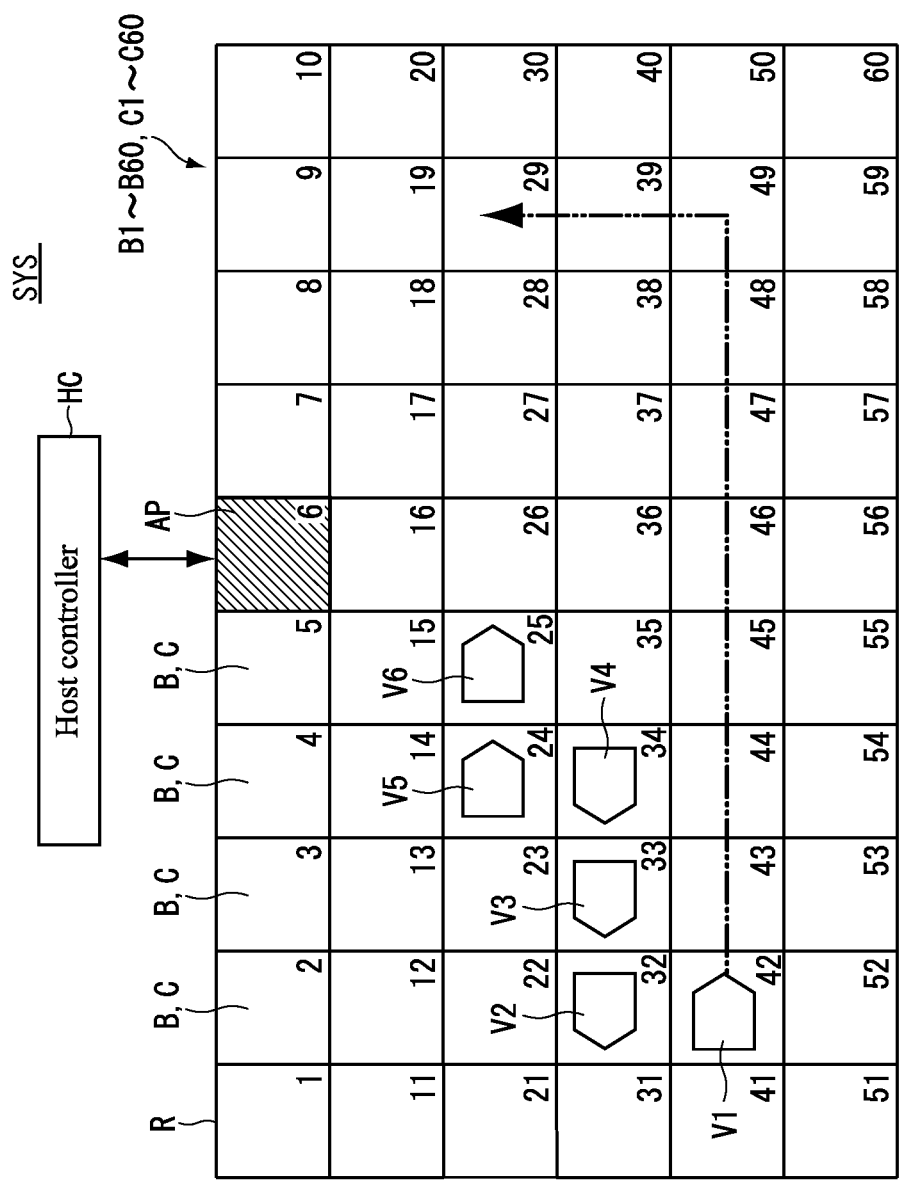
FIG. 8 is a diagram showing an example of an operation of the transport vehicle system.

Next, control of the transport vehicle V performed by the host controller HC and the blocking controller BC will be described. FIG. 6 is a diagram showing an example of the operation sequence of the transport vehicle V, the host controller HC, and the blocking controller BC. FIG. 7 is a flowchart showing an example of the operation of the in-vehicle controller 50 of the transport vehicle V. FIG. 8 is a diagram showing an example of the operation of the transport vehicle system SYS. FIG. 8 illustrates a part of the grid-patterned track R. In FIG. 8, grid cells C and blocking sections B in the portions denoted by digits "1 to 60" are grid cells C1 to C60 and blocking sections B1 to B60. In the grid cell C6, an access point AP is set for performing wireless communication between the host controller HC and the blocking controller BC. The transport vehicle V transmits or receives information to or from the host controller HC and the blocking controller BC through wireless communication via the access point AP, using the antennas 19.

The host controller HC assigns a transport instruction to a transport vehicle V (Step S1). The host controller HC selects from the plurality of transport vehicles V a transport vehicle V able to transport an article M, and assigns a transport instruction to the transport vehicle V. The host controller HC generates a transport instruction, based on state information of each transport vehicle V, map information showing the location of each part (such as processing apparatus, storage apparatus, or buffer) related to the transport vehicle system SYS, position information of an article M, and so forth. A transport instruction includes instructions such as a traveling instruction that causes the transport vehicle V to travel along a predetermined route, a pickup instruction to pick up an article M at a predetermined location, and an unloading instruction to unload the picked-up article M to a predetermined location.

For example, as shown in FIG. 8, as a transport instruction, the host controller HC assigns to the transport vehicle V an instruction that causes it to execute pickup of an article M at the grid cell C42, to travel along the traveling route from the grid cell C42 to the grid cell C29 indicated by the two-dot chain line while holding the article M, and to execute unloading of the article M at the grid cell C29.

Upon the transport vehicle V receiving the transport instruction, the procession permission request generator 55 of the in-vehicle controller 50 generates a procession permission request regarding a plurality of blocking sections B through which the transport vehicle V of its own is to pass along the traveling route defined by the transport instruction (Step S2). The procession permission request generated by the procession permission request generator 55 is transmitted by the communicator 52 to the blocking controller BC (Step S3). The blocking controller BC may make a transmission request to each transport vehicle V through cyclic communication, and the transmission of the procession permission request in Step S3 may be performed as a response to this transmission request.

Upon receiving the procession permission request, the blocking controller BC determines whether or not to permit procession to the blocking sections B, for which the procession permission request has been made (Step S4). If a procession permission regarding the blocking sections B has been granted to another transport vehicle V, the blocking controller BC determines not to permit procession, however, if a procession permission regarding the blocking sections B has not been granted, the blocking controller BC determines to permit the transport vehicle V that requested for a procession permission to proceed thereto. If it is determined to permit procession in Step S4, a procession permission is transmitted to the transport vehicle V that transmitted the procession permission request (Step S5). The transport vehicle V that has received the procession permission proceeds to the blocking sections B for which a procession permission is granted, and executes an operation on the basis of the transport instruction (Step S6).

In the exemplary transport vehicle system SYS, each transport vehicle V is controlled by repeatedly performing the operations of Step S1 to Step S6 in FIG. 6. As described above, each transport vehicle V communicates information such as a transport instruction through wireless communication with the host controller HC, and proceeds to blocking sections B through wireless communication with the blocking controller BC. For example, as shown in FIG. 8, when other transport vehicles V2 to V6 are present between the transport vehicle V1 executing a transport instruction and the access point AP, the other transport vehicles V2 to V6 may obstruct the wireless communication and the radio wave intensity of the communication may be reduced as a result. For example, the other transport vehicles V2 to V6 are executing the operation of transferring articles M and are therefore at a stop. In such a configuration, information cannot be transmitted through wireless communication between the transport vehicle V1 and the host controller HC or the blocking controller BC, and, for example, the transport vehicle V1 may become unable to obtain a procession permission for the blocking section B to proceed to next and may stop as a result. Now, if the transport vehicle V does not include a mechanism for changing the positions or the postures of the antennas 19, the transport vehicle V itself cannot move and thus the positions or the posture of the antennas 19 cannot be changed. Therefore, the communication quality of the wireless communication performed by the antennas 19 cannot be improved. Consequently, the transport vehicle V continues to be unable to obtain a procession permission for the blocking section B to proceed to next, and will continue to be in the stop state.

FIG. 7 is a flowchart showing an example of the operation of the in-vehicle controller 50 of the transport vehicle V. As shown in FIG. 7, the determiner 56 of the in-vehicle controller 50 determines whether or not the communication quality of wireless communication with other devices through the communication system CS has continued to stay below a predetermined value for a certain period of time or longer (Step S11). In Step S11, the determiner 56 may acquire the intensity of a radio wave signal input or output by the communicator 52, for example, at predetermined time intervals, and may make a determination on the basis of the intensity of the radio wave signal. If the determiner 56 determines the communication quality as not having continued to stay below the predetermined value for a certain period of time or longer (NO in Step S11), it is considered that the wireless communication is appropriately established with other devices, and the process ends.

On the other hand, if the determiner 56 determines the communication quality as having continued to stay below the predetermined value for a certain period of time or longer (YES in Step S11), it is considered that the communication quality (radio wave intensity) is inadequate for performing wireless communication with other devices, and the antennas 19 are rotated by a predetermined amount (Step S12). In Step S12, the in-vehicle controller 50 drives the rotation driver 12 to rotate the frame W and the antennas 19 axially around the vertical axis AX1. The in-vehicle controller 50 may rotate the rotation driver 12 at a predetermined speed, or may move the rotation driver 12 in steps at predetermined angular intervals. The positions of the antennas 19 can be changed by using the existing transferer 18 (rotation driver 12).

Next, the determiner 56 determines whether or not the rotation amount of the antennas 19 exceeds a set value (Step S13). In Step S13, the determiner 56 determines whether or not the rotation amount of the antennas 19 exceeds a preliminarily set rotation amount. The determiner 56 determines whether or not the rotation amount of the antennas 19 exceeds, for example, 360° serving as the set value. If the determiner 56 determines the rotation amount of the antennas 19 as not exceeding the set value (NO in Step S13), the processes of Step S11 and thereafter are repeated. That is to say, in Step S11, the determiner 56 determines whether or not the communication quality acquired while rotating the antennas 19 has continued to stay below a predetermined value for a certain period of time or longer.

The in-vehicle controller 50 holds the positions of the antennas 19 (the positions of the antennas 19 at which the radio wave intensity is greater than or equal to a predetermined value) at which the communication quality does not continue to stay below the predetermined value for a certain period of time or longer. Now, the transport vehicle V (transport vehicle V1 shown in FIG. 8) can communicate information with the host controller HC or the blocking controller BC, and can resume the execution of the transport instruction. If the determiner 56 again determines the rotation amount of the antennas 19 as not exceeding the set value in Step S11 (NO in Step S13), the processes of Step S12 and thereafter are performed.

If the determiner 56 determines the rotation amount of the antennas 19 as exceeding the set value (YES in Step S13), the in-vehicle controller 50 executes a fault process such as issuing an error or an alert (Step S14), and the process ends. In Step S14, the in-vehicle controller 50 may, instead of issuing an error or an alert, execute another process (countermeasure) such as changing the communication channel as a fault process. Moreover, before performing the process of Step S14, the in-vehicle controller 50 may wait for a predetermined period of time (for example, several minutes) to elapse, and then perform the processes of Step S11 and thereafter again. For example, there are some instances where any of the other transport vehicles V2 to V6 shown in FIG. 8 may have completed the operation of transferring an article M and may have proceeded from the grid cell C already, and in these instances, there is a possibility that the communication quality around the transport vehicle V1 may already have improved. Also, the host controller HC or the blocking controller BC may identify a transport vehicle V (transport vehicle V1 in FIG. 8) that has not performed communication for a predetermined time, and notify the operator of the presence of the transport vehicle V with which communication cannot be made.

Figure 9:
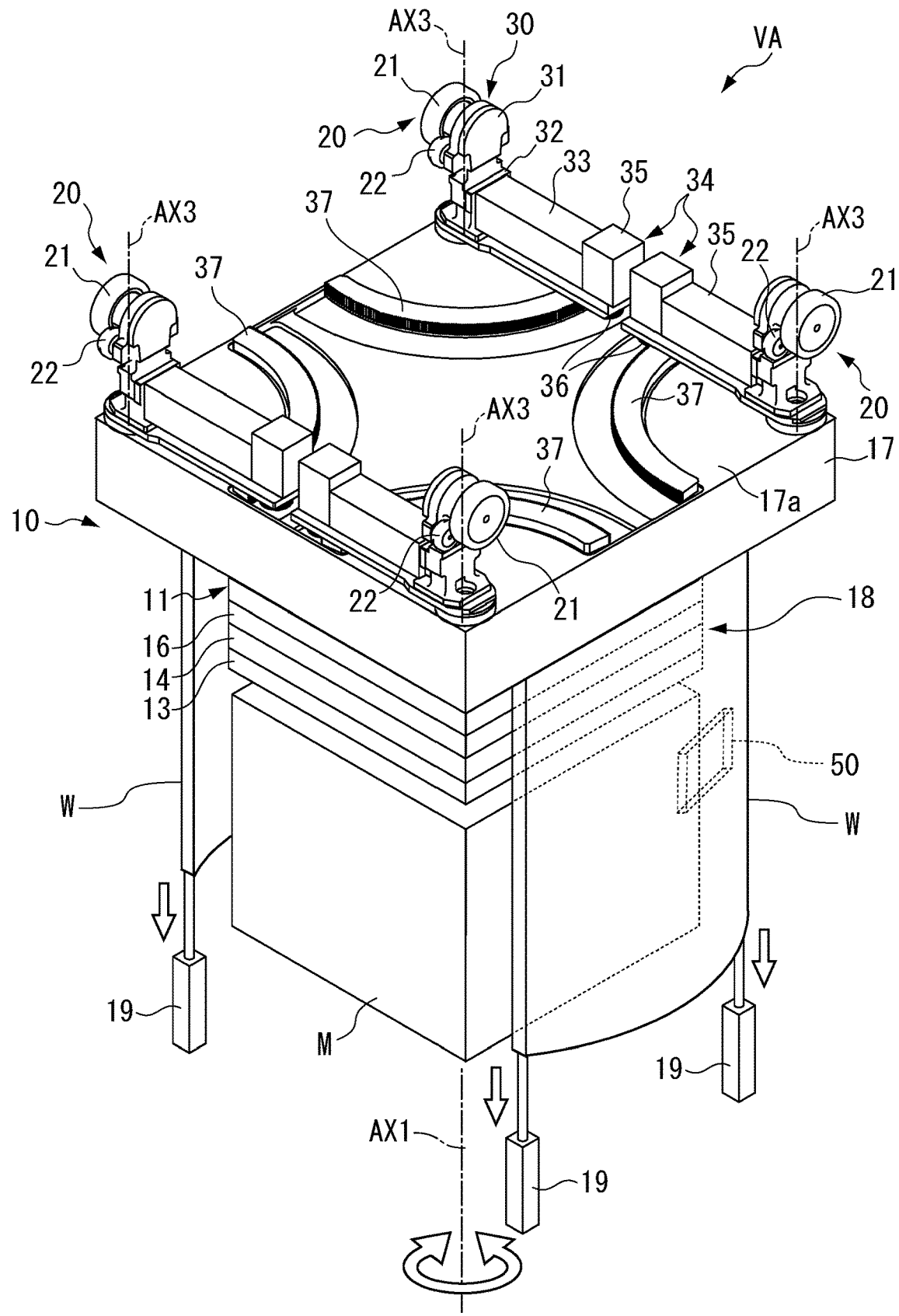
FIG. 9 is a perspective view showing a transport vehicle according to another example.

FIG. 9 is a perspective view showing another example of the transport vehicle. A transport vehicle VA shown in FIG. 9 is of a configuration in which the vertical positions of the antennas 19 can be changed. The other configurations in the transport vehicle VA are similar to those in the transport vehicle V described above. Also, these similar configurations are assigned with the same reference signs and the descriptions thereof are omitted or simplified. In the form shown in FIG. 9, the positions of the antennas 19 can be changed downward in the vertical direction. As shown in FIG. 9, the antennas 19 can make movements that combine rotation around the vertical axis AX1 and linear motion in the vertical direction, allowing the positions of the antennas 19 to move in a wider range. The downward position change of the antennas 19 can be executed by a simple actuator, and it is therefore possible to suppress a significant cost increase. Also, a configuration may be applied in which positions of the antennas 19 are maintained by a locking mechanism and the antennas 19 are lowered by their own weight as the antennas 19 are released from the maintained positions in synchronization with the rotation of the antennas 19, for example.

As described above, it is possible using the driving mechanism in the existing transferer 18 to change at least the positions or the postures of the antennas 19 without separately providing a mechanism for driving the antennas 19 in the transport vehicle V. It is also possible to improve the state of communication performed through the antennas 19 even when the transport vehicle V (travelers 20) itself is in a stop state, and suppress the increase in size and weight of the transport vehicle V.

Another example has been described above. However, the technical scope of the disclosure is not limited to the description of the above example. It is also apparent to those skilled in the art that various modifications or improvements can be added to the above example. The technical scope of the disclosure also encompasses one or more of modifications or improvements. One or more of the requirements described in the above example may be omitted. One or more of the requirements described in the above example may be combined where appropriate. The order of executing processes shown can be realized in an arbitrary order unless an output of the previous processing is used in the following processing. While operations in the above example have been described with expressions such as "first," "next" and "subsequently" for the sake of convenience, the operations need not always be implemented in that order. The contents of Japanese Patent Application No. 2019-114535 and all documents cited in the detailed description are incorporated herein by reference.

In the example described above, it has been described that the positions of the antennas 19 are changed by rotating the antennas 19, however, the expressions containing the phrase "changing the positions of the antennas 19" or similar are also used in a sense of changing the postures of the antennas 19.

Furthermore, in the above example, a form of mounting the antennas 19 on the lower end of the frame W is described as an example, however, my transport vehicles are not limited to this form. For example, the antennas 19 may be provided in a state of projecting in the horizontal direction (for example, in the tangential direction of the outer circumference of the frame W in a plan view) on the outer upper part of the frame W.

Also, in the above example, a form of arranging the antennas 19 along the vertical direction (Z direction) is described as an example, however, my transport vehicles are not limited to this form. For example, the antennas 19 may be mounted on the frame W in a state of being tilted with respect to the vertical direction.

The invention claimed is:

1. A transport vehicle comprising:
    a traveler;
    a transferer mounted on the traveler and receives or delivers an article from or to a transfer destination;
    an antenna provided so that at least the position or the posture thereof can be changed to follow action of the transferer, and that performs wireless communication with another device; and
    a rotation driver that rotates the transferer around a vertical axis, wherein
    the position of the antenna around the vertical axis is changed to follow the rotation of the transferer by the rotation driver, wherein
    the transferer includes a lateral mechanism that causes a holder for holding an article to move horizontally,
    the rotation driver causes the lateral mechanism to rotate around the vertical axis, and
    the antenna is provided in a portion of the transferer other than the portion that is moved horizontally by the lateral mechanism.

2. The transport vehicle according to claim 1, further comprising:
    a frame that surrounds the transferer and is rotated around the vertical axis together with the transferer by the rotation driver, wherein
    the antenna is mounted on the frame.

3. A transport vehicle comprising:
    a traveler;
    a transferer mounted on the traveler and receives or delivers an article from or to a transfer destination;
    an antenna provided so that at least the position or the posture thereof can be changed to follow action of the transferer, and that performs wireless communication with another device; and
    a rotation driver that rotates the transferer around a vertical axis, wherein
    the position of the antenna around the vertical axis is changed to follow the rotation of the transferer by the rotation driver, and
    a frame that surrounds the transferer and is rotated around the vertical axis together with the transferer by the rotation driver, wherein
    the antenna is mounted on the frame.

4. The transport vehicle according to claim 3, wherein the antenna is mounted in a state of projecting downward from a lower end of the frame.

5. A transport vehicle comprising:
    a traveler;
    a transferer mounted on the traveler and receives or delivers an article from or to a transfer destination; and
    an antenna provided so that at least the position or the posture thereof can be changed to follow action of the transferer, and that performs wireless communication with another device , wherein the traveler travels on a grid-patterned track, proceeds to a cell if a procession permission corresponding to each of the cells of the grid of the track is granted by communicating with the another device via the antenna, and does not proceed to the cell if the procession permission is not granted.

* * * * *